United States Patent [19]

Allen et al.

[11] Patent Number: 5,233,501
[45] Date of Patent: Aug. 3, 1993

[54] DIGITAL TELECOMMUNICATION NETWORK CROSS-CONNECT MODULE HAVING A PRINTED CIRCUIT BOARD CONNECTED TO JACK SWITCHES

[75] Inventors: Brian J. Allen, Spokane; Duane B. Kutsch, Otis Orchards; Donald R. Skinfill, Veradale, all of Wash.

[73] Assignee: Telect, Inc., Liberty Lake, Wash.

[21] Appl. No.: 843,902

[22] Filed: Feb. 27, 1992

[51] Int. Cl.⁵ .................. H05K 7/02; H01R 17/18; H01R 21/22
[52] U.S. Cl. .................. 361/733; 439/188; 439/668; 200/51.04; 200/51.09; 361/683
[58] Field of Search ............ 439/61, 188, 668; 361/392, 393, 394, 395, 399; 200/51.03, 51.04, 51.09, 51.1; 375/36

[56] References Cited

U.S. PATENT DOCUMENTS

| | | |
|---|---|---|
| 4,002,399 | 1/1977 | Deitch et al. |
| 4,423,466 | 12/1983 | Beun .................. 439/668 X |
| 4,426,558 | 1/1984 | Tanaka et al. .......... 200/51.09 |
| 4,609,242 | 9/1986 | Kemppainen. |
| 4,628,159 | 12/1986 | Deitch et al. .......... 200/51.05 |
| 4,705,921 | 11/1987 | Rabey et al. .......... 200/51.09 X |
| 4,749,968 | 6/1988 | Burroughs .......... 333/105 |
| 4,770,639 | 9/1988 | Lau .................. 439/61 |
| 4,797,114 | 1/1989 | Lau .................. 439/668 X |
| 4,815,104 | 3/1989 | Williams et al. ........ 375/36 |
| 4,820,200 | 4/1989 | Lau .................. 200/51.09 X |
| 4,840,568 | 6/1989 | Burroughs et al. ........ 439/49 |
| 4,861,281 | 8/1989 | Warner .............. 439/668 X |
| 4,874,317 | 10/1989 | Lau .................. 439/61 X |
| 4,975,087 | 12/1990 | Williams et al. ........ 439/668 |
| 5,078,624 | 1/1992 | Burroughs et al. ........ 439/668 |

FOREIGN PATENT DOCUMENTS

| | | |
|---|---|---|
| 1582238 | 7/1990 | U.S.S.R. .............. 439/188 |
| 2111770 | 7/1983 | United Kingdom ........ 439/668 |
| 2112589 | 7/1983 | United Kingdom ........ 439/668 |

Primary Examiner—Leo P. Picard
Assistant Examiner—Michael W. Phillips
Attorney, Agent, or Firm—Wells, St. John, Roberts, Gregory & Matkin

[57] ABSTRACT

A digital communication network having a digital cross-connect system is described for facilitating the insulation, testing, monitoring, restoration and repair of digital telecommunication apparatus. The system includes a plurality of digital cross-connect modules 10. Each module 10 has an input jack 32, and output jack 34, cross-connect input jack 36 and cross-connect output jack 38 mounted on the front panel for providing front panel access. Each of the jacks is mounted to a printed circuit board having printed circuit board terminals. BNC or TNC coaxial connectors are mounted on the rear panel. The jacks and the connectors are interconnected via printed circuit board traces. Each of the modules has a switch structure for interconnecting jacks and for providing termination before break capability. Each of the jacks automatically interrupts the circuit when a coaxial plug is inserted into a respective jack to isolate the conductor.

14 Claims, 8 Drawing Sheets

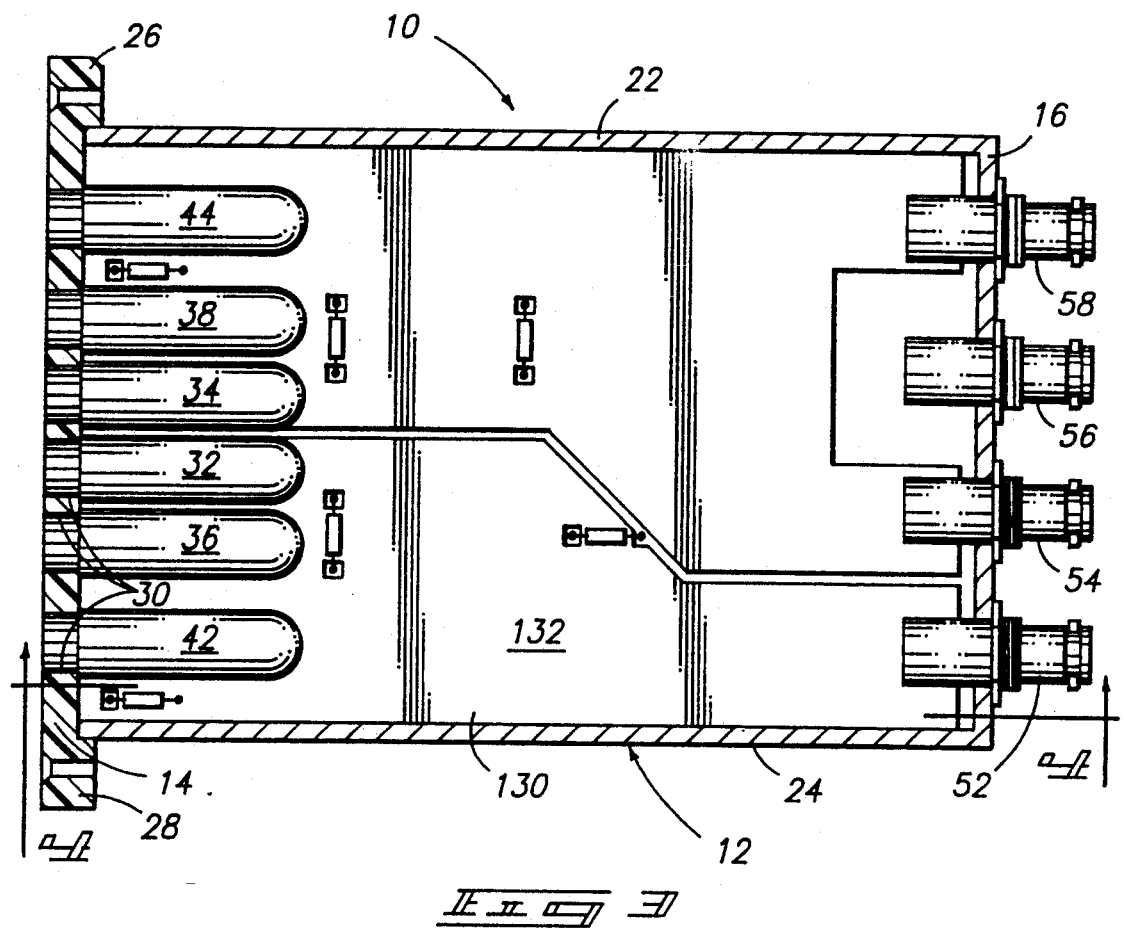
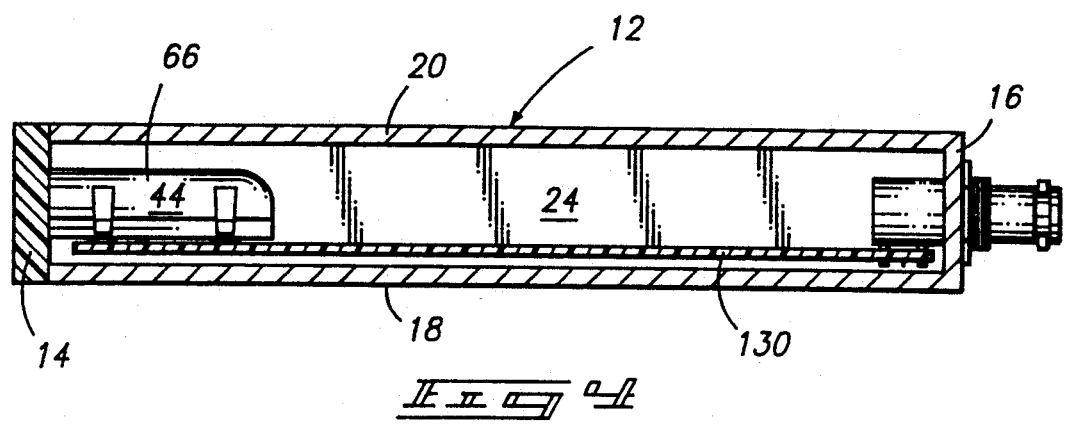

DIGITAL TELECOMMUNICATION NETWORK CROSS-CONNECT MODULE HAVING A PRINTED CIRCUIT BOARD CONNECTED TO JACK SWITCHES

TECHNICAL FIELD

This invention relates to digital telecommunication network cross-connect modules having printed circuit boards electrically interconnecting front panel jack assemblies with rear panel connectors.

BACKGROUND OF THE INVENTION

Digital signal cross-connect equipment plays a very vital role in the installation, monitoring, testing, restoring and repairing digital telecommunication networks. Digital signal cross-connect modules are frequently used in digital networks to provide a central cross-connect location that is convenient for testing, monitoring, restoring and repairing the digital signals and associated equipment. The digital cross-connect modules provide temporary jack access to the digital signals to monitor the signals and to test and repair the digital signals and equipment. Digital signal cross-connect modules are most frequently used in both large and small telephone central offices, remote sites, and customer premises. It is necessary that with respect to the remainder of the network, the digital signal cross-connect module must appear transparent. This is particularly true and most critical when dealing with digital signals that are transmitted at line rates in excess of 40 million bits per second (Mbps).

A very successful digital signal cross-connect module is described in U.S. Pat. No. 4,815,104 granted to Wayne E. Williams et al. on Mar. 21, 1989. Such patent is referred to and incorporated by reference with respect to the background of this invention.

This invention is an improved digital telecommunications network, cross-connect modules that has several improvements which enable the module to be constructed at a lower cost without significant degradation of performance.

These and other objects and advantages of this invention will become apparent upon reading the following detailed description of a preferred embodiment.

BRIEF DESCRIPTION OF THE DRAWINGS

Preferred embodiment of the invention is described below with reference to the accompanying drawings, which are briefly described below.

FIG. 3 is a vertical cross sectional view taken along line 3—3 in FIG. 1 illustrating the interior of the module emphasizing the location of a printed circuit board supporting and interconnecting the front panel jacks and the coaxial rear connectors;

FIG. 4 is a horizontal cross sectional view taken along line 4—4 in FIG. 3 further illustrating the location of a printed circuit board with respect to the front panel jacks and the rear panel coaxial connectors;

DETAILED DESCRIPTION OF THE PREFERRED EMBODIMENT

Figure 1:
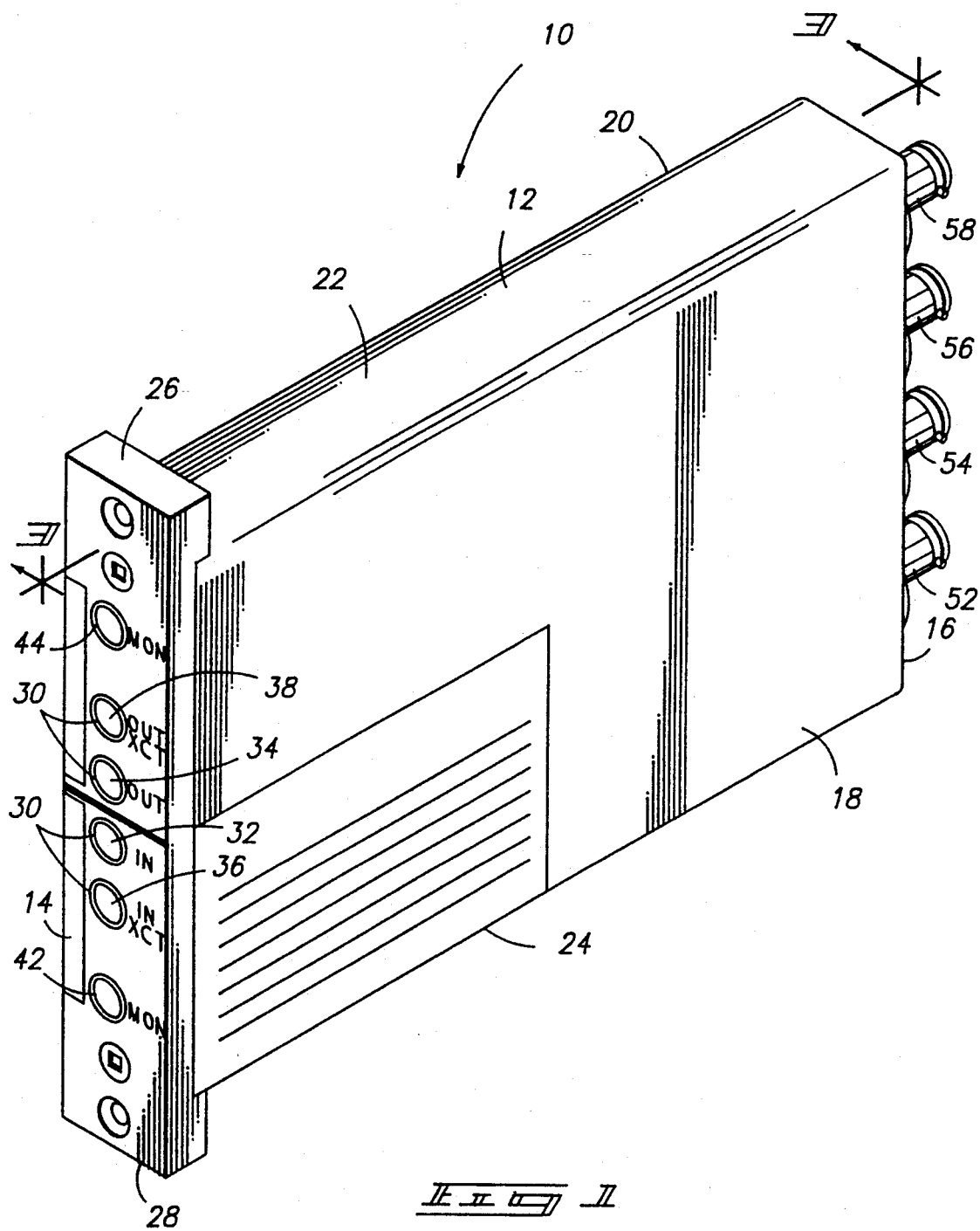
FIG. 1 is a perspective front view of a preferred embodiment, emphasizing a front panel of the module illustrating the location of front panel jacks.
Figure 2:
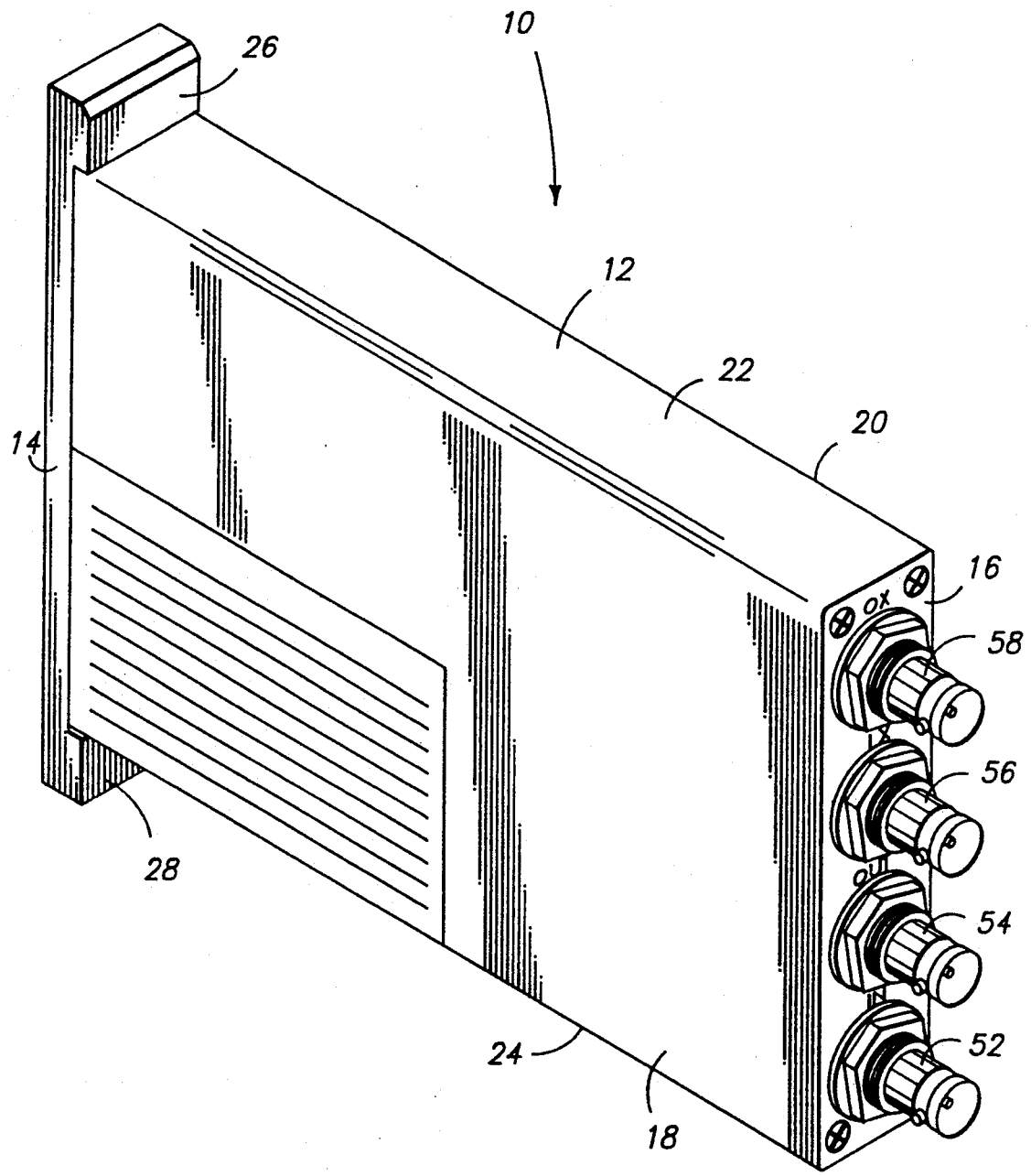
FIG. 2 is a rear perspective view of the module illustrated in FIG. 1 which emphasizes coaxial rear connectors on a back panel of the module.

This disclosure of the invention is submitted in furtherance of the constitutional purposes of the U.S. Patent Laws "to promote the progress of science and useful arts" (Article 1, Section 8).

Referring now to the drawings as illustrated in FIGS. 1-4, a digital cross-connect module generally designated with the numeral 10 for interconnecting or cross-connecting telecommunication equipment in a telecommunication network at a remote location. The module 10 provides a central access location at a front panel of a terminal unit for facilitating installation, monitoring, testing, restoration and repair of telecommunication equipment. A single module 10 generally interconnects two telecommunication apparatuses of a network. The module 10 is mounted in a rack or bank with similar modules forming a digital signal cross-connect terminal unit. Most frequently the terminal unit is mounted in bays at a convenient central location in a large or small central telephone office or at remote sites or at customer premises. The module 10 is able to appear transparent to the digital telecommunication network and is capable of transmitting digital information between the telecommunication apparatuses at a high rate in excess of 40 million bits per second (Mbps), particularly DS-3 at 44,736 Mbps and DS-4 at 272.176 Mbps.

The module 10 includes a slim housing or case 12 that includes an elongated rather narrow front panel 14. The panel 14 is elongated in the vertical dimension and narrow in the horizontal dimension to enable a plurality of panels to be mounted side by side to formulate a terminal unit. The housing 12 provides a RF-EMI shield to prevent RF energy from interfering with the transmission of the digital signals. The front panel 14 faces the front of the terminal unit and provides easy access to enable telecommunication transmission engineers, installers, and repair personnel to have convenient remote electrical access to the telecommunication circuits and networks from the front panel 14.

The housing 12 further includes a back panel or wall 16 that is elongated in the vertical dimension and narrow in the horizontal dimension to provide a slim profile for the module. The back panel faces the rear of the terminal unit and provides limited access. The housing 12 includes side walls or panels 18 and 20 that extend between a top wall 22 and a bottom wall 24.

The elongated front panel 14 has a front panel upper flange 26 and a front panel lower flange 28 that extend outward to facilitate the mounting of the module 10 to the digital signal cross-connect terminal unit or rack. The front panel 14 includes a plurality of front panel apertures 30 for receiving coaxial jacks.

In a preferred embodiment, the module 10 (FIGS. 3 and 8) includes an input jack 32, and output jack 34, a cross-connect input jack 36 and a cross-connect output jack 38. Each of the jacks 32, 34, 36 and 38 have front sections that project into respective front panel apertures 30 for receiving coaxial jack plugs. Preferably the jacks 32, 34, 36 and 38 as shown in FIG. 1 and FIG. 3 are evenly spaced with respect to each other at a desired interval commensurate with the axial spacing of a coaxial looping plug so that the coaxial looping plug may simultaneously be inserted (1) in the input jack 32 and the output jack 34, or (2) in the input jack 32 and the cross-connect input jack 36, or (3) in the output jack 34 and the cross-connect output jack 38. The input jack 32 is mounted intermediate and evenly spaced between the output jack 34 and the input cross-connect jack 36. The output jack 34 is positioned intermediate the input jack 32 and the cross-connect output jack 38. More specifically, the input jack 32 is mounted immediately above the cross-connect input jack 36 and the output jack 34 is mounted immediately above the input jack 32. The cross-connect output jack 38 is mounted intermediate above the output jack 34. The parallel relationship of the jacks 32, 34, 36 and 38 is illustrated more specifically in FIGS. 3 and 8.

The module 10 also includes an input monitoring jack 42 and an output monitoring jack 44 that are likewise mounted in the front panel 14. The input monitoring jack 42 is preferably mounted below the cross-connect input jack 36 and the output monitoring jack 44 is preferably mounted above the cross-connect output jack 38.

The module 10 (FIG. 2) further includes a coaxial input connector 52, a coaxial output connector 54, a coaxial input cross-connect connector 56, a coaxial output cross-connect connector 58, each mounted in the back panel 16. The connectors 52, 54, 56 and 58 are preferably BNC or TNC coaxial connectors frequently referred to as "installer" connectors. The connectors 52, 54, 56 and 58 are respectively connected to the digital signal lines or equipment in which the input connector 52 is connected to a digital signal input portion of a first line or first telecommunication apparatus of a telecommunication network (not shown). The output connector is connected to the output portion of the first line or first telecommunication equipment (not shown). The cross-connect input connector 56 is connected to a digital signal input portion of a second line or second telecommunication apparatus (not shown). The cross-connect output connector is connected to an output portion of the second line or second piece of telecommunication equipment (not shown). Coaxial cables (not shown) are most frequently used to connect the telecommunication equipment to the module connectors 52, 54, 56 and 58. Frequently the coaxial cables are placed and supported in trays that extend generally horizontal along the back panels 16 at the termination unit.

Generally once the connectors 52, 54, 56 and 58 are connected with the coaxial cables, they are seldom disconnected. For the purpose of this invention, it will be considered that the connectors 52, 54, 56 and 58 are of a permanent connection although it is recognized that such connectors may be disconnected from the telecommunication equipment when the equipment is being rearranged, disassembled or the like.

Figure 8:
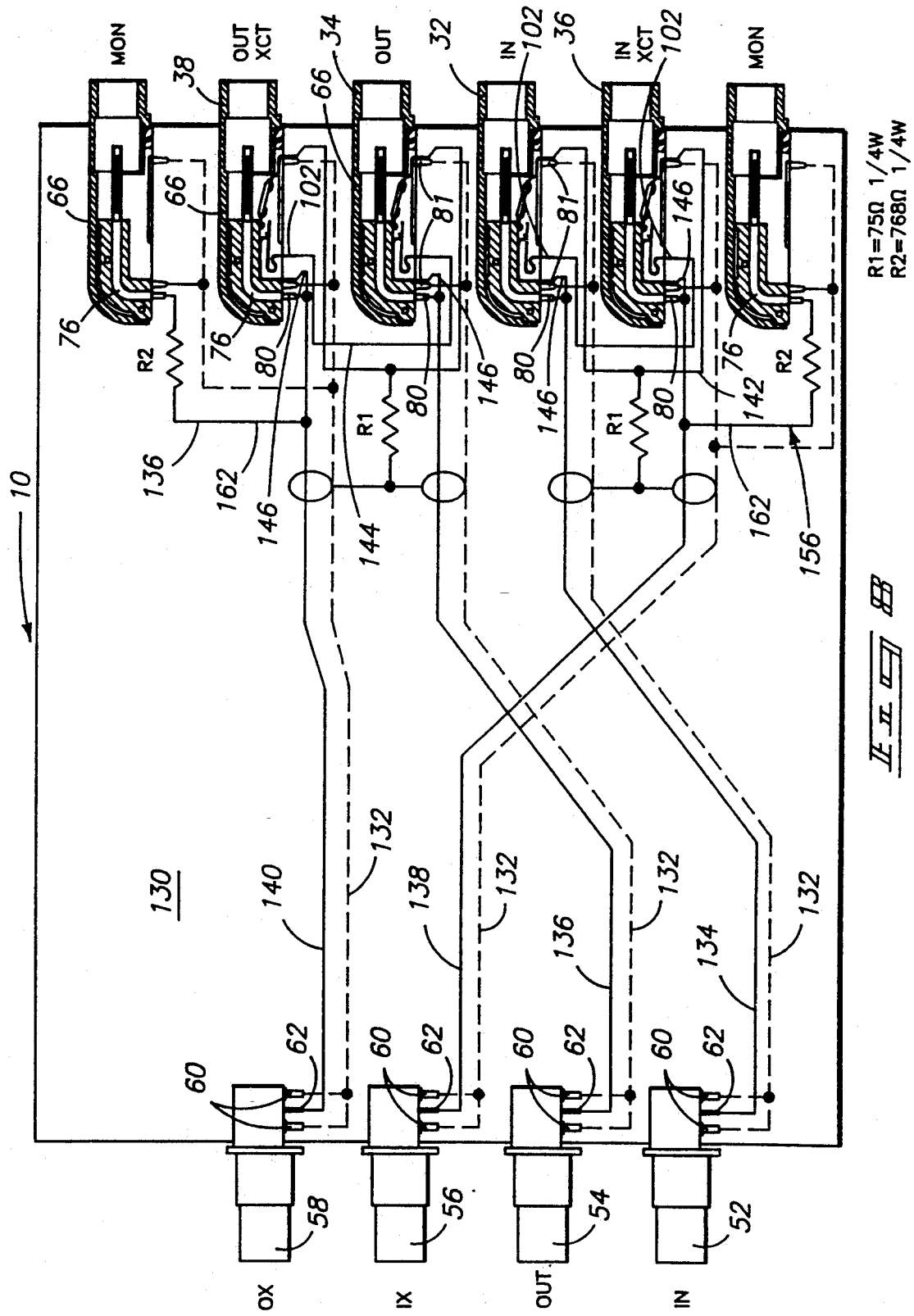
FIG. 8 is an electrical circuit diagram view of the printed circuit board illustrating the electrical paths of the printed circuit board and the connection with the various printed circuit terminals of the front panel jacks and of the coaxial rear connectors.

As illustrated in FIG. 8, each of the coaxial connectors 52, 54, 56 and 58 have printed circuit board terminals 60 that are connected to ground and a printed circuit board central conductor coaxial terminal 62 that transmits the digital signal.

Each of the jacks, 32, 34, 36 and 38 have a jack housing 66 (FIGS. 5-7) that is of a general cylindrical shape comprising a barrel 68 having a forward end 70 with a plug opening 72 formed therein extending inward to a plug receiving cavity 73 of a rather traditional configuration. However, the jack housing 66 has a rear end 74 with a curved portion. A central female conductor 76 is mounted coaxially within the plug receiving cavity 73 with a rear curved section 78 at the rear end 74 that extends and terminates in a printed circuit board terminal 80 for transmitting a digital signal between the central female conductor 76 of the jack and a central male coaxial conductor of a coaxial plug. Additionally, the jack housing 66 has printed circuit board terminals 81 that extend outward from the barrel for connecting with printed circuit ground plane conductors.

The jack housing 66 (FIGS. 5-7) has a jack switch cavity 82 formed in a side of the barrel 68 spaced from the central female conductor 76. Importantly a jack switch 83 is mounted in the jack switch cavity 82. The jack switch has a substantially stationary switch contact element 84 mounted on housing guides 85 within the jack switch cavity 82. the stationary switch contact element 84 has a substantially stationary contact end 86 that extends through an intermediate section to a printed circuit board switch terminal 90.

The jack switch 83 further includes a movable switch contact element 92 that has a leaf spring contact section 94 that extends outward to a projecting leaf spring end 96. The movable switch contact element 92 extends to a printed circuit board switch terminal 102. The movable switch contact element 92 is mounted in the jack switch cavity 82 by housing guides 100.

The jack switch 83 further includes a switch actuating means 104 that includes a leaf spring element 106 that is mounted in the switch cavity 82 by housing mounting guides 108. The leaf spring element 106 has a lever section 110 that extends outward overlying the projecting leaf spring end 96 of the movable switch contact element 92. Lever section 110 has a contact engaging end 112 for engaging the projecting leaf spring end 96 to terminate the digital signal being transmitted via the stationary contact 84 and the movable contact 92. The leaf spring element 106 includes an intermediate section that extends from the lever section 110 to a printed circuit board actuation terminal 116.

The switch actuation means 104 includes a non-conductive bumper element 118 mounted on the lever section 110 which is engaged by a forward end of a plug for moving the lever section 110 from a non-contact position to an initial contact position in which the contacting end 112 engages the projecting leaf spring end 96 terminating or grounding the digital signal. Further insertion of the plug causes the projecting lever section 110 to break the leaf spring contact section 94 from the stationary contact end 84 to open the jack switch and interrupt the transmission of the digital signal.

An important component of the module 10 is a multi-layer printed circuit board 130 that is mounted within the housing 12 for receiving the multitude of printed circuit board terminals of the front panel jacks and the rear panel coaxial connectors. The printed circuit board 130 includes grounded conductive outer layers that provide ground planes 132 (FIG. 3) to minimize the generation of stray signals that would interfere or compromise the transmission of the high frequency digital signals.

Figure 9:
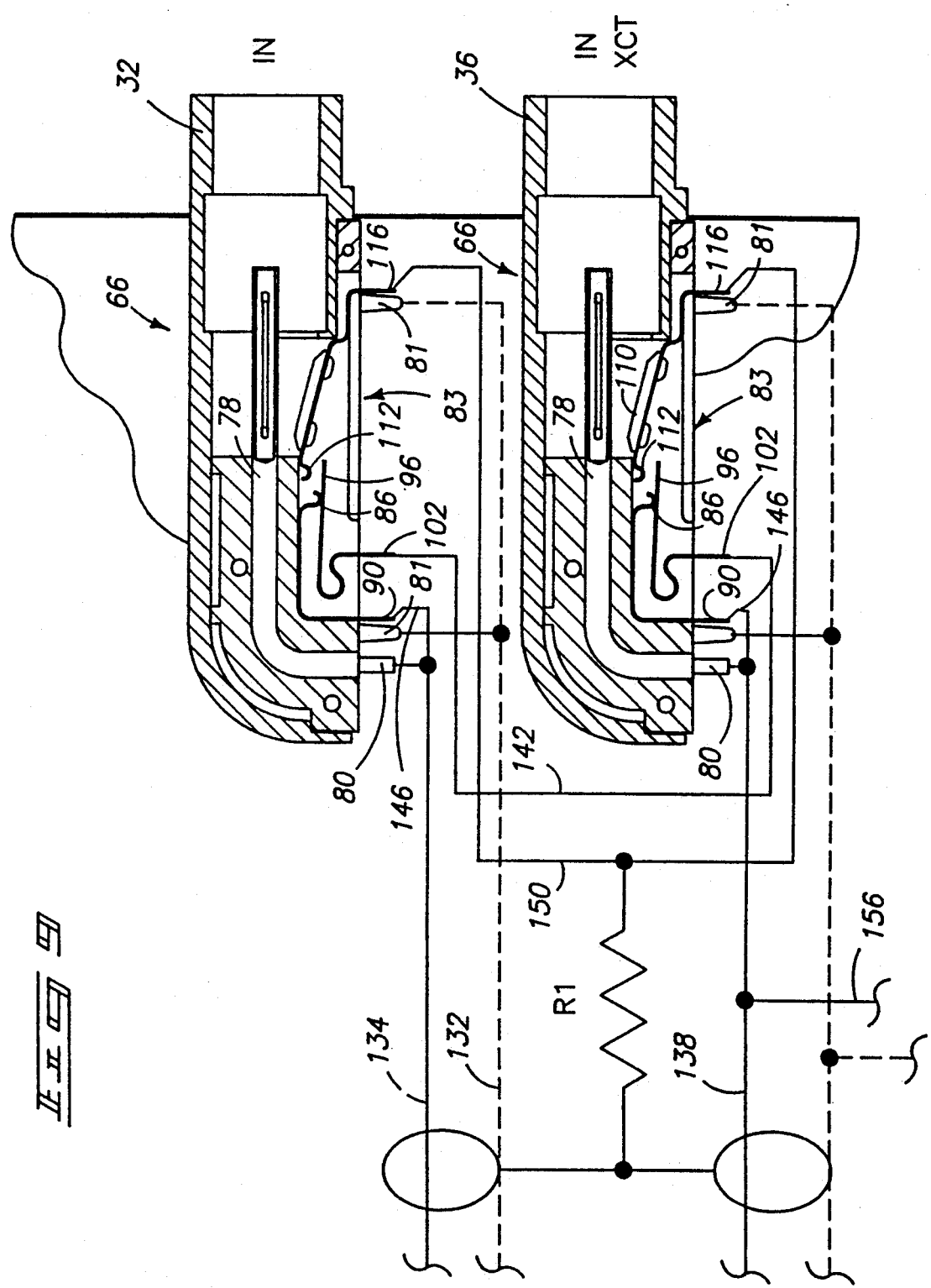
FIG. 9 is a fragmentary enlarged view of a portion of FIG. 8 illustrating the printed circuit connectors with the IN and IN cross-connect (XCT) jack.

The printed circuit board 130 is illustrated in schematic form in FIGS. 8 and 9. An input printed circuit conductor or trace 134 extends from the printed circuit board coaxial terminal 62 of the coaxial input connector 52 to the printed circuit board jack terminal 80 of the input jack 32. The printed circuit board 130 includes an output printed circuit board conductor or trace 136 that extends between the printed circuit board coaxial conductor terminal 62 of the coaxial output conductor 54 and the printed circuit board terminal 80 of the output jack 34. The printed circuit board 130 further includes an input cross-connect printed circuit conductor or trace 138 that extends from the printed circuit board coaxial terminal 62 of the coaxial input cross-connect connector 56 to the printed circuit board jack terminal 80 of the cross-connect input jack 36. Furthermore, the printed circuit board 130 includes an output cross-connect printed circuit conductor or trace 140 that extends between the coaxial output cross-connect connector 58 and the printed circuit board jack terminal 80 of the cross-connect output jack 38.

The jack switch 83 of the input jack 32 is connected in series with the jack switch 83 of the input cross-connect jack 36 utilizing an input switch printed circuit conductor or trace 142 on the printed circuit board. Likewise, the jack switch 83 of the output jack 34 is connected in series with the jack switch 83 of the cross-connect output jack 38 via an output switch printed circuit conductor or trace 144. The conductor 144 extends between the printed circuit board switch terminals 102 to interconnect the jack switches of the output jack 34 and the cross-connect output jack 38.

The printed circuit board further includes printed circuit jumpers or traces 146 that extend and interconnect the printed circuit board jack terminals 80 of the central female conductor 76 of each jack with the printed circuit board terminal 90 of the stationary switch contact elements 84. It should be noted that jack switches 83 are spaced from the central female conductor 76 and that the stationary switch contact element 84 is interconnected with the printed circuit board terminal 80 via the printed circuit board jumper or trace 146. It should be further noted that none of the jack switch elements 84, 92 and 106 engage the central female conductor 76.

The module 10 further includes a termination circuit 150 that is operatively connected to the printed circuit board terminal 116 for terminating the digital signal when the engaging end 112 engages the projecting leaf spring end 96 to terminate the signal to a preset voltage. This is generally referred to as "grounding the signal", although the digital signal is not directly terminated to ground but is terminated through a known resistor $R_1$ which is preferably has a resistance value of 75 ohms. Consequently the jack switch 83 may be referred to as a "termination before break switch" in which the digital signal is terminated to a preset DC voltage level before the switch is opened to interrupt the digital signal between the telecommunication apparatus.

The module 10 further includes a monitor circuits 156 that includes a resistor $R_2$ that interconnect the central conductors of the monitor jacks 42 and 44 with a monitor printed circuit board conductor 162 that connects with respective output cross-connect printed circuit board conductors or traces 140 and input cross-connect printed circuit board conductors or traces 138.

Figure 5:
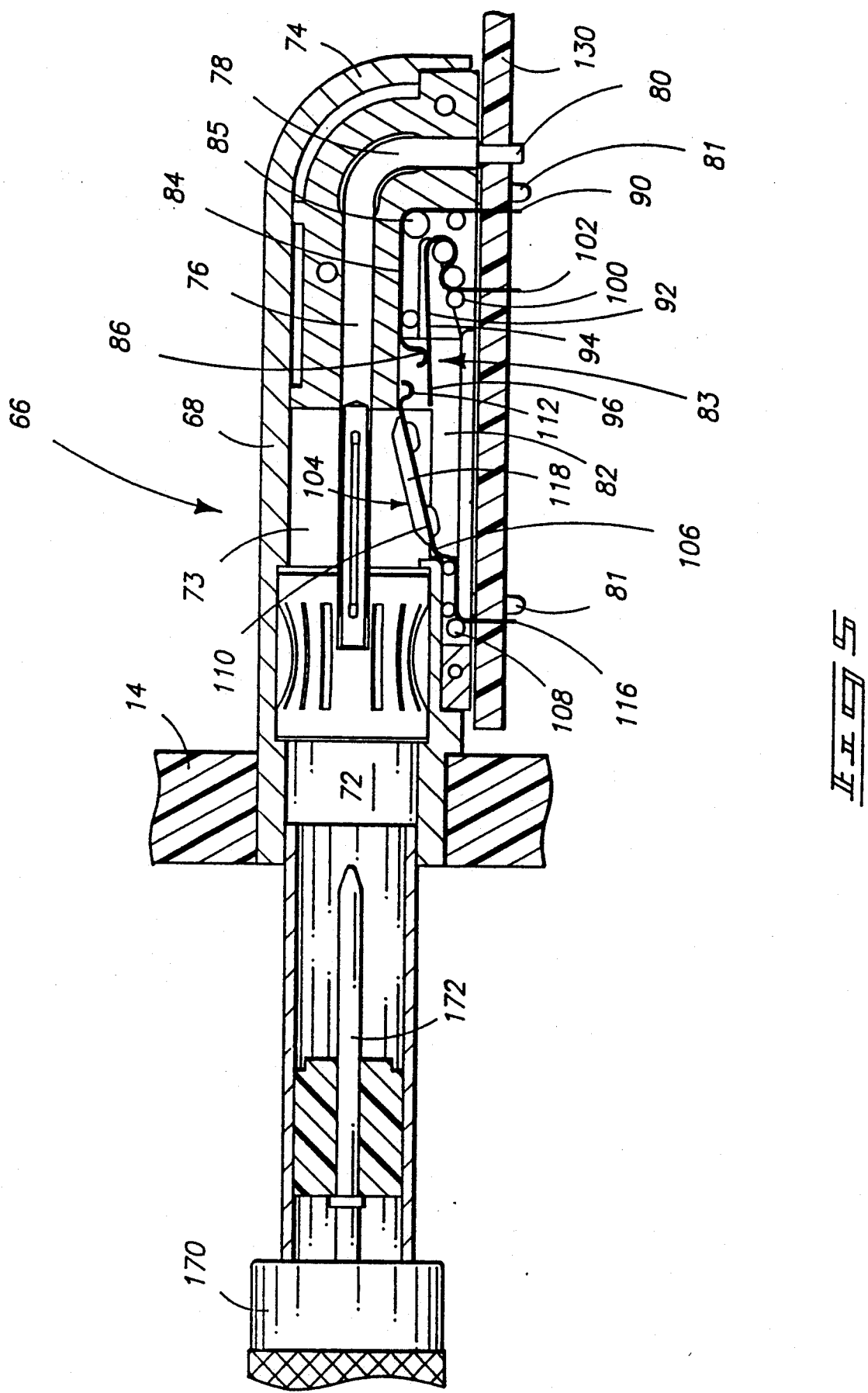
FIG. 5 is a horizontal cross sectional view of a single front panel jack mounted on the printed circuit board illustrating the initial insertion of a coaxial plug.
Figure 6:
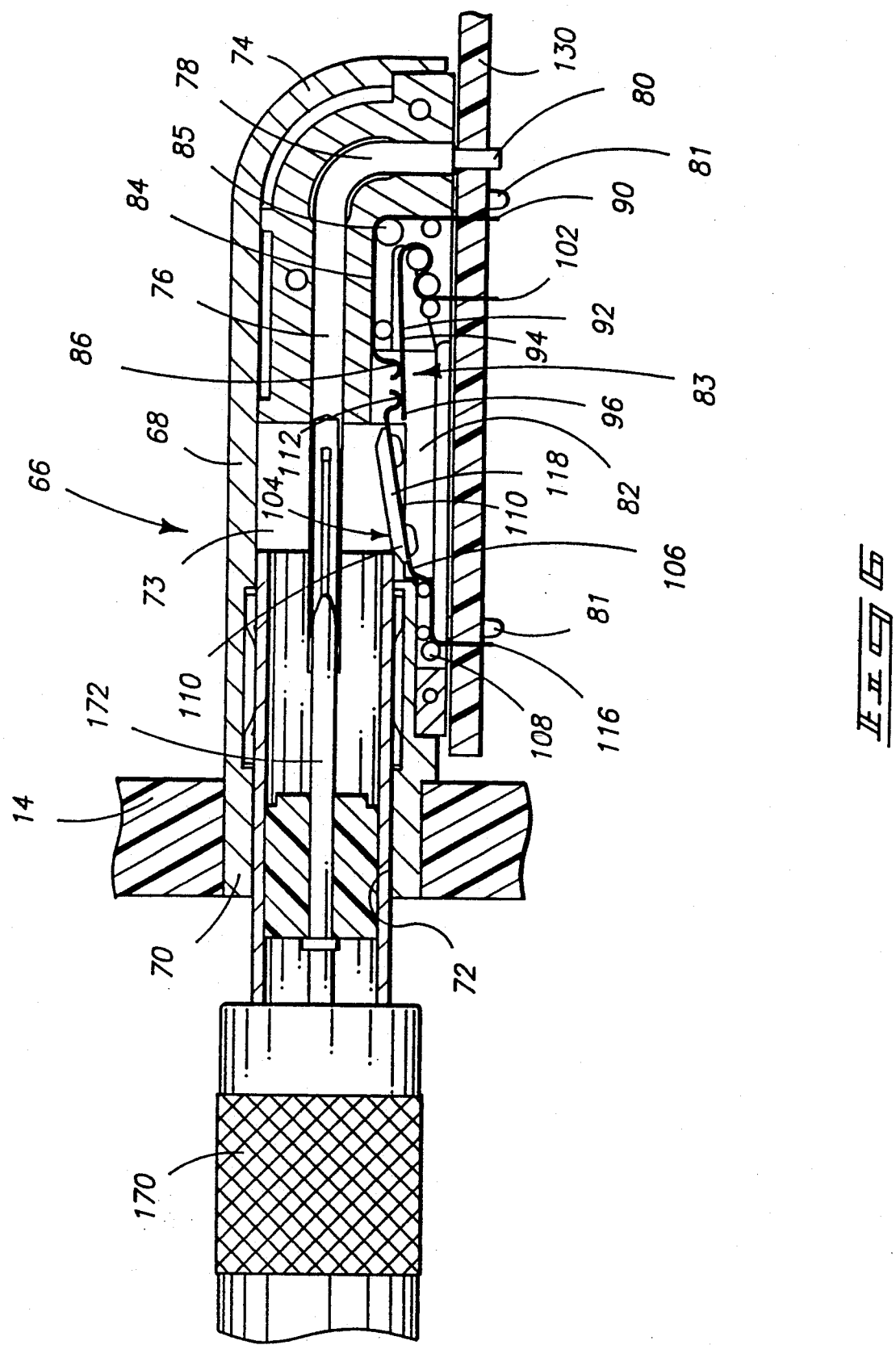
FIG. 6 is a cross sectional view similar to FIG. 5 except showing the plug further inserted into the jack in which the plug initially actuates a jack switch mechanism to terminate cross-connect digital signal transmission.
Figure 7:
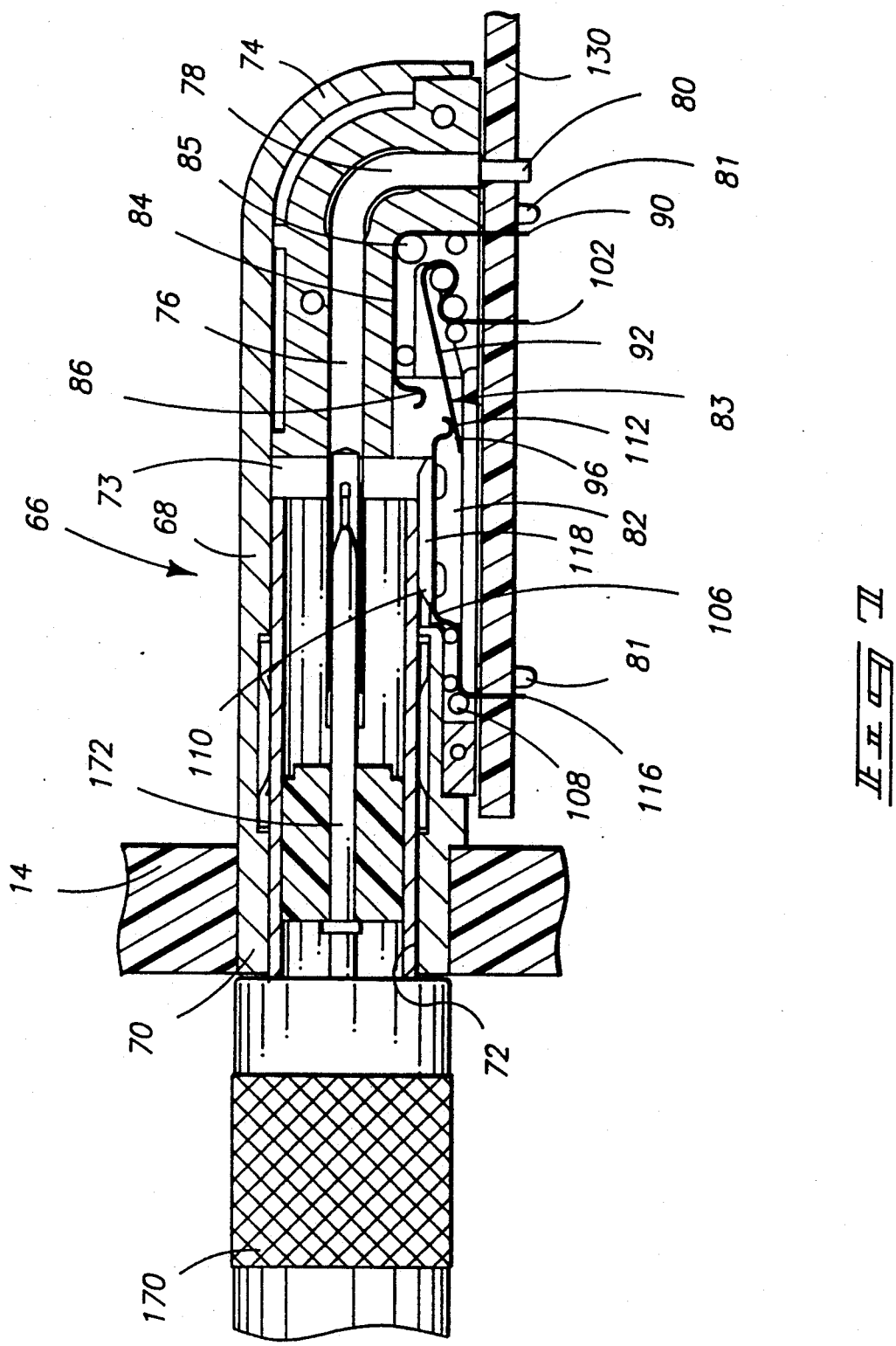
FIG. 7 is a cross sectional view similar to FIG. 6 except showing the plug fully inserted into the jack in which the switch mechanism is further actuated to break switch contact to interrupt the transfer of cross-connect digital signals between the telecommunication apparatuses.

A sequence of operation of the jack switch 83 is illustrated in FIGS. 5, 6 and 7. FIG. 5 illustrates the initial insertion of a coaxial plug 170 such as a coaxial cable plug or a plug element of a looping plug. It should be noted that the bumper 118 is in the path of the sleeve of the plug 170 as the plug 170 is further inserted as illustrated in FIG. 6, in which the central male coaxial conductive element 172 engages the central female conductor 76 of the jack. It should be noted at this point, the bumper is engaged by the frontal surface of the sleeve of the plug 170 causing the bumper to move downward biasing the lever section 110 downward with the engaging end 112 contacting the projecting leaf spring end 96 terminating the digital signal through the termination circuit 150 to the preset voltage utilizing the resistor $R_1$.

Further insertion of the plug 170, as illustrated in FIG. 7, further deflects that lever section 110 causing engaging end 112 to further press against the projecting leaf spring end 96 to cause the leaf spring contact section 96 to disengage from the contact end 86 of the stationary contact element 84 to interrupt the digital signal between the telecommunication apparatuses enabling the plug to communicate directly with the respective telecommunication unit from the front panel.

It should be appreciated that the module 10 enables the installer, tester, monitor or repair person to utilize a patch cord to isolate any one of the connectors 52, 54, 56 and 58 from the front of the terminal unit and reroute the line temporarily to connect at a different module. The module 10 greatly increases the ability of the transmission engineer and his staff to detect problems or abnormalities and to isolate the abnormalities and make a proper repair. Furthermore the module 10 provides a cross-connect capability at the front panel. Still further, it enables looping plugs to be utilized for testing the circuits by rerouting the circuits directly from the front panel. The module 10 has a unique jack switch structure in each of the jacks 32, 34, 36 and 38 that reduces the amount of digital information that is lost in transmission from a cross-connect condition to a patch condition. It is found that the module 10 enables restoration of jack surfaces in less than five seconds. Furthermore the module 10 provides for a relatively inexpensive structure while providing substantial reliability. The module 10 provides a reduced cost and provides the customer with a high quality product at the same or lower price than previously.

In compliance with the statute, the invention has been described in language more or less specific as to methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A telecommunication network digital cross-connect module for providing front panel access for monitoring, testing, or temporarily reconnecting various digital telecommunication apparatus, comprising:

a module housing having a front panel with jack apertures and a rear panel spaced a desired distance from the front panel;

an input jack having a forward open end positioned in one of the jack apertures for selectively receiving a coaxial electrical plug at the front panel to electrically connect with an input jack central conductor;

an output jack having a forward open end positioned in another of the jack apertures for selectively receiving a coaxial electrical plug at the front panel to electrically connect with an output jack central conductor;

a rear input coaxial cable connector mounted to the rear panel having a rear input digital signal conductor for normally connecting through a coaxial cable to a digital signal input portion of one telecommunication apparatus;

a rear output coaxial cable connector mounted to the rear panel having a rear output digital signal conductor for normally connecting through a coaxial cable to a digital signal output portion of the one telecommunication apparatus;

a rear input cross-connect coaxial cable connector mounted to the rear panel having a rear input cross-connect digital signal conductor for normally connecting through a coaxial cable to a digital signal input portion of another telecommunication apparatus;

a rear output cross-connect coaxial cable connector mounted to the rear panel having a rear output cross-connect conductor for normally connecting through a coaxial cable to a digital signal output portion of the other telecommunication apparatus;

said input jack having an input jack switch responsive to the insertion of a plug into the input jack for (1) normally operatively electrically cross-connecting the input portion of the one telecommunication apparatus with the input portion of the other telecommunication apparatus to transmit a digital input signal between the telecommunication apparatuses when a plug is not inserted into the input jack, and (2) for discontinuing the cross-connecting of the one telecommunication apparatus with the input portion of the other telecommunication apparatus to interrupt transmission of the digital input signal between the telecommunication apparatuses and permit operative electrical connection of the plug with the digital signal input portion of the one telecommunication apparatus when the plug is inserted into the input jack;

said output jack having an output jack switch responsive to the insertion of a plug into the output jack for (1) normally operatively electrically cross-connecting the output portion of the one telecommunication apparatus with the output portion of the other telecommunication apparatus to transmit a digital output signal between the telecommunication apparatuses when a plug is not inserted into the output jack, and (2) for operatively discontinuing the cross-connecting of the output portion of the one telecommunication apparatus with the output portion of the other telecommunication apparatus to interrupt transmission of the digital output signal between the telecommunication apparatus and permit operative electrical connection of the plug with the digital signal output portion of the one telecommunication apparatus when the plug is inserted into the output jack;

wherein each of the jacks has a jack housing with a separate switch compartment and wherein each of the jack switches has two electrical contacts spaced from the central conductor that are biased to engage each other when a plug is not inserted in the jack to transmit a digital signal between the telecommunication apparatuses, and an actuation means responsive to the insertion of a plug into any one of the jacks for separating the two electrical contacts from engagement with each other to interrupt transmission of the digital signal between the telecommunication apparatuses;

wherein each of the jack switches has signal termination means responsive to the insertion of a plug into the jack for terminating the transmitted digital signal to a preset voltage level prior to the interruption of the transmitted digital signal.

wherein each of the jack switches has (1) a first printed circuit board switch terminal operatively electrically connected to one of the two switch contacts, and (2) a second printed circuit board switch terminal operatively electrically connected to the other of the two switch contacts;

a printed circuit board mounted in the housing having (1) a first printed circuit conductor electrically interconnecting the rear input digital signal connector with the first printed circuit board switch terminal of the input jack switch, (2) a second printed circuit conductor operatively electrically interconnecting the rear input cross-connect digital signal connector with the first printed circuit board switch terminal of the input jack switch, (3) a third printed circuit conductor electrically interconnecting the rear output coaxial cable connector with the first printed circuit board switch terminal of the output jack switch, and (4) a fourth printed circuit conductor operatively electrically interconnecting the rear output cross-connect coaxial cable connector with the second printed circuit board switch terminal of the output jack switch.

2. The telecommunication network digital cross-connect module as defined in claim 1 wherein each of the central conductors of the jacks has a printed circuit terminal and wherein the printed circuit board has printed circuit conductive jumpers electrically interconnecting the printed circuit terminals of the central conductor with the first printed circuit switch terminals of the jack switch.

3. The telecommunication network digital cross-connect module as defined in claim 1 wherein the signal termination means includes a third contact responsive to the actuation means for engaging one of the two switch contacts prior to the interruption of the digital signal to terminate the digital signal to the preset voltage.

4. The telecommunication network digital cross-connect module as defined in claim 3 wherein the signal termination means includes a third printed circuit switch terminal connected to the third contact and wherein the printed circuit board has (1) a ground plane conductive trace, a termination conductive trace connected to the third printed circuit switch terminal and a resistive element mounted on the printed circuit board and electrically interposed between the ground plane conductive trace and the termination conductive trace to terminate the digital signal through the resistive element to ground when the third contact engages one of the jack switch contacts.

5. The telecommunication network digital cross-connect module as defined in claim 3 wherein the signal terminating means includes a spring lever arm with the third contact thereon and wherein the actuation means is mounted on the spring lever arm to cause the spring lever arm to move in response to the insertion of a plug in a jack to initially move the third contact into engagement with one of the two switch contacts to terminate the digital signal and then move the third contact further to separate the two switch contact from engagement to interrupt the digital signal.

6. The telecommunication network digital cross-connect module as defined in claim 1 further comprising:
an input cross-connect jack having a forward open end positioned in one of the jack apertures for selectively receiving a coaxial electrical plug at the front panel to electrically connect with an input cross-connect jack central coaxial conductor;
an output cross-connect jack having a forward open end positioned in another of the jack apertures for selectively receiving a coaxial electrical plug at the front panel to electrically connect with an output cross-connect jack central coaxial conductor;
said input cross-connect jack having an input cross-connect jack switch responsive to the insertion of a plug into the input cross-connect jack for (1) normally operatively electrically cross-connecting the input portion of the one telecommunication apparatus with the input portion of the other telecommunication apparatus to transmit a digital input signal between the telecommunication apparatuses when a plug is not inserted into the input jack, and (2) for discontinuing the cross-connecting of the one telecommunication apparatus with the input portion of the other telecommunication apparatus to interrupt transmission of the digital input signal between the telecommunication apparatuses and permit electrical connection of the plug with the digital signal input portion of the one telecommunication apparatus when the plug is inserted into the input cross-connect jack;
said output cross-connect jack having an output cross-connect jack switch responsive to the insertion of a plug into the output cross-connect jack for (1) normally operatively electrically cross-connecting the output portion of the one telecommunication apparatus with the output portion of the other telecommunication apparatus to transmit a digital output signal between the telecommunication apparatuses when a plug is not inserted into the output jack, and (2) for operatively discontinuing the cross-connecting of the output portion of the one telecommunication apparatus with the output portion of the other telecommunication apparatus to interrupt transmission of the digital output signal between the telecommunication apparatuses and permit electrical connection of the plug with the digital signal output portion of the one telecommunication apparatus when the plug is inserted into the output cross-connect jack;
wherein the printed circuit board has (5) a fifth printed circuit board conductor interconnecting the second printed circuit board terminals of the input jack switch and the input cross-connect jack switch to electrically interconnect the input jack switch and the input cross-connect jack switch in series and (6) a sixth printed circuit board conductor interconnecting the second printed circuit board terminals of the output jack switch and the output cross-connect jack switch to electrically interconnect the output jack switch and the output cross-connect jack switch in series.

7. A telecommunication network digital cross-connect module for providing front panel access for monitoring, testing, or temporarily reconnecting various digital telecommunication apparatus, comprising:
a module housing having a front panel with jack apertures and a rear panel spaced a desired distance from the front panel;
an input jack having a forward open end positioned in one of the jack apertures for selectively receiving a coaxial electrical plug at the front panel to electrically connect with an input jack central coaxial conductor;
an output jack having a forward open end positioned in another of the jack apertures for selectively receiving a coaxial electrical plug at the front panel to electrically connect with an output jack central coaxial conductor;
an input cross-connect jack having a forward open end positioned in one of the jack apertures for selectively receiving a coaxial electrical plug at the front panel to electrically connect with an input cross-connect jack central coaxial conductor;
an output cross-connect jack having a forward open end positioned in another of the jack apertures for selectively receiving a coaxial electrical plug at the front panel to electrically connect with an output cross-connect jack central coaxial conductor;
a rear input coaxial cable connector mounted to the rear panel having a rear input digital signal conductor for normally connecting through a coaxial cable to a digital signal input portion of one telecommunication apparatus;
a rear output coaxial cable connector mounted to the rear panel having a rear output digital signal conductor for normally connecting through a coaxial cable to a digital signal output portion of the one telecommunication apparatus;
a rear input cross-connect coaxial cable connector mounted to the rear panel having a rear input cross-connect digital signal conductor for normally connecting through a coaxial cable to a digital signal input portion of another telecommunication apparatus;
a rear output cross-connect coaxial cable connector mounted to the rear panel having a rear output cross-connect conductor for normally connecting through a coaxial cable to a digital signal output portion of the other telecommunication apparatus;
said input jack having an input jack switch responsive to the insertion of a plug into the input jack for (1) normally operatively electrically cross-connecting the input portion of the one telecommunication apparatus with the input portion of the other telecommunication apparatus to transmit a digital input signal between the telecommunication apparatuses when a plug is not inserted into the input jack, and (2) for discontinuing the cross-connecting of the one telecommunication apparatus with the input portion of the other telecommunication apparatus to interrupt transmission of the digital input signal between the telecommunication apparatuses and permit electrical connection of the plug with the digital signal input portion of the one telecommunication apparatus when the plug is inserted into the input jack;

said output jack having an output jack switch responsive to the insertion of a plug into the output jack for (1) normally operatively electrically cross-connecting the output portion of the one telecommunication apparatus with the output portion of the other telecommunication apparatus to transmit a digital output signal between the telecommunication apparatuses when a plug is not inserted into the output jack, and (2) for operatively discontinuing the cross-connecting of the output portion of the one telecommunication apparatus with the output portion of the other telecommunication apparatus to interrupt transmission of the digital output signal between the telecommunication apparatuses and permit electrical connection of the plug with the digital signal output portion of the one telecommunication apparatus when the plug is inserted into the output jack;

said input cross-connect jack having an input cross-connect jack switch responsive to the insertion of a plug into the input cross-connect jack for (1) normally operatively electrically cross-connecting the input portion of the one telecommunication apparatus with the input portion of the other telecommunication apparatus to transmit a digital input signal between the telecommunication apparatuses when a plug is not inserted into the input jack, and (2) for discontinuing the cross-connecting of the one telecommunication apparatus with the input portion of the other telecommunication apparatus to interrupt transmission of the digital input signal between the telecommunication apparatuses and permit electrical connection of the plug with the digital signal input portion of the one telecommunication apparatus when the plug is inserted into the input cross-connect jack;

said output cross-connect jack having an output cross-connect jack switch responsive to the insertion of a plug into the output cross-connect jack for (1) normally operatively electrically cross-connecting the output portion of the one telecommunication apparatus with the output portion of the other telecommunication apparatus to transmit a digital output signal between the telecommunication apparatuses when a plug is not inserted into the output jack, and (2) for operatively discontinuing the cross-connecting of the output portion of the one telecommunication apparatus with the output portion of the other telecommunication apparatus to interrupt transmission of the digital output signal between the telecommunication apparatuses and permit electrical connection of the plug with the digital signal output portion of the one telecommunication apparatus when the plug is inserted into the output cross-connect jack;

wherein each of the jack switches has (1) a first printed circuit board switch terminal operatively electrically connected to its respective central coaxial conductor, and (2) a second printed circuit switch board terminal;

a printed circuit board mounted in the housing having (1) a first printed circuit conductor electrically interconnecting the rear input digital signal connector with the first printed circuit board switch terminal of the input jack switch, (2) a second printed circuit conductor electrically interconnecting the rear input cross-connect digital signal connector with the first printed circuit board switch terminal of the input cross-connect jack switch, (3) a third printed circuit conductor electrically interconnecting the rear output coaxial cable connector with the first printed circuit board switch terminal of the output jack switch, (4) a fourth printed circuit conductor electrically interconnecting the rear output cross-connect coaxial cable connector with the first printed circuit board switch terminal of the output cross-connect jack switch (5) a fifth printed circuit board conductor interconnecting the second printed circuit board terminals of the input jack switch and the input cross-connect jack switch to electrically interconnect the input jack switch and the input cross-connect jack switch in series, and (6) a sixth printed circuit board conductor interconnecting the second printed circuit board terminals of the output jack switch and the output cross-connect jack switch to electrically interconnect the output jack switch and the output cross-connect jack switch in series.

8. The telecommunication network digital cross-connect module as defined in claim 7 wherein each of the jacks has a jack housing with a switch compartment and wherein each of jack switches is mounted in a corresponding switch compartment and has (1) a substantially stationary electrical contact electrically connected to one of the printed circuit switch terminals, (2) a movable spring electrical contact electrically connected to the other printed circuit terminals that is biased to engage the substantially stationary electrical contact when a plug is not inserted in the jack to transmit a digital signal between the telecommunication apparatuses, and (3) an actuation means responsive to the insertion of a plug into a jack for deflecting the movable spring electrical contact from engagement with the substantially stationary electrical contact to interrupt transmission of the digital signal between the telecommunication apparatus.

9. The telecommunication network digital cross-connect module as defined in claim 8 wherein each of the stationary switch contacts are mounted within its respective switch compartment spaced from the central coaxial conductor and wherein each of the movable switch contacts engages its corresponding stationary contact spaced from the central coaxial conductor.

10. The telecommunication network digital cross-connect module as defined in claim 8 wherein each of the central conductors of the jacks has a printed circuit terminal and wherein the printed circuit board has printed circuit conductive jumpers electrically interconnecting the printed circuit terminals of the central conductors with the first printed circuit switch terminals.

11. The telecommunication network digital cross-connect module as defined in claim 8 wherein each of the jack switches has signal termination means responsive to the insertion of a plug into the jack for terminating the transmitted digital signal to a preset voltage prior to the interruption of the transmitted digital signal.

12. The telecommunication network digital cross-connect module as defined in claim 11 wherein the signal termination means includes a second movable contact responsive to the actuating means for engaging one of the switch contacts prior to the interruption of the digital signal to terminate the digital signal to the preset voltage.

13. The telecommunication network digital cross-connect module as defined in claim 12 wherein the signal termination means includes a third printed circuit switch terminal connected to the second moveable contact and wherein the printed circuit board has (1) a ground plane conductive trace, a termination conductive trace connected to the third printed circuit terminal and a resistive element mounted on the printed circuit switch board and electrically interposed between the ground plane conductive trace and the termination conductive trace to terminate the digital signal through the resistive element to ground when the second movable contact engages one of the jack switch contacts.

14. The telecommunication network digital cross-connect module as defined in claim 12 wherein the signal terminating means includes a spring lever arm with the second movable contact thereon and wherein the actuation means is mounted on the spring lever arm to cause the spring lever arm move in response to the insertion of a plug in a jack to initially move the second movable contact into engagement with one of the jack switch contacts to terminate the digital signal and then move the second movable contact further to move the movable switch contact from engagement with the stationary contact to interrupt the digital signal.

* * * * *